US 10,476,426 B2

(12) United States Patent
Wildman

(10) Patent No.: US 10,476,426 B2
(45) Date of Patent: Nov. 12, 2019

(54) SYSTEMS AND METHODS FOR COLLECTING SOLAR ENERGY USING A TILTED LINEAR SOLAR COLLECTOR

(71) Applicant: Craig Bradley Edward Wildman, Kensington, CA (US)

(72) Inventor: Craig Bradley Edward Wildman, Kensington, CA (US)

(73) Assignee: Craig Bradley Edward Wildman, Kensington, CA (US)

( * ) Notice: Subject to any disclaimer, the term of this patent is extended or adjusted under 35 U.S.C. 154(b) by 88 days.

(21) Appl. No.: 15/374,669

(22) Filed: Dec. 9, 2016

(65) Prior Publication Data

US 2017/0170780 A1 Jun. 15, 2017

Related U.S. Application Data

(60) Provisional application No. 62/265,163, filed on Dec. 9, 2015.

(51) Int. Cl.
*H02S 20/32* (2014.01)
*H02S 20/10* (2014.01)
(Continued)

(52) U.S. Cl.
CPC .............. *H02S 20/32* (2014.12); *F24S 20/20* (2018.05); *F24S 23/79* (2018.05); *F24S 30/20* (2018.05);
(Continued)

(58) Field of Classification Search
CPC .......... H02S 20/30; H02S 20/32; H02S 40/20; H02S 40/22; H02S 40/44; H02S 20/10;
(Continued)

(56) References Cited

U.S. PATENT DOCUMENTS 3,986,921 A 10/1976 Putnam, Jr.
4,209,222 A 6/1980 Posnansky
(Continued)

FOREIGN PATENT DOCUMENTS

CN 202393960 8/2012
EP 2161516 A1 3/2010
(Continued)

*Primary Examiner* — Lindsey A Bernier
(74) *Attorney, Agent, or Firm* — Kwan & Olynick LLP

(57) ABSTRACT

Various embodiments of the present disclosure relate to systems and processes for collecting solar energy. According to particular embodiments, a solar collector device comprises one or more primary reflectors, and a receiver assembly mounted on a frame structure. The receiver assembly comprises one or more secondary concentrators and a heat transfer tube. Each primary reflector comprises a flat elongated mirror mounted on a structural backing that is rotatably coupled to the frame structure such that each primary reflector may pivot around a pivot axis. The receiver assembly may translate along the frame structure in a direction that is parallel to the pivot axes of the one or more primary reflectors. The one or more primary reflectors reflect light focused upon the receiver assembly such that heat energy from the reflected light is transferred to a heat transfer fluid in the heat transfer tube.

20 Claims, 11 Drawing Sheets

(51) Int. Cl.
  *H02S 20/30* (2014.01)
  *H02S 40/22* (2014.01)
  *F24S 20/20* (2018.01)
  *H02S 40/10* (2014.01)
  *H01L 31/052* (2014.01)
  *H02S 40/44* (2014.01)
  *H01L 31/054* (2014.01)
  *F24S 30/20* (2018.01)
  *F24S 30/428* (2018.01)
  *F24S 23/79* (2018.01)
  *F24S 23/70* (2018.01)

(52) U.S. Cl.
  CPC .......... *F24S 30/428* (2018.05); *H01L 31/052* (2013.01); *H01L 31/0521* (2013.01); *H01L 31/0547* (2014.12); *H02S 20/10* (2014.12); *H02S 20/30* (2014.12); *H02S 40/10* (2014.12); *H02S 40/22* (2014.12); *H02S 40/44* (2014.12); *F24S 2020/23* (2018.05); *F24S 2023/872* (2018.05); *Y02E 10/47* (2013.01); *Y02E 10/52* (2013.01); *Y02E 10/60* (2013.01)

(58) Field of Classification Search
  CPC ... Y02E 10/52; H01L 31/052; H01L 31/0547; F24S 20/20; F24S 30/20; F24S 2020/23
  See application file for complete search history.

(56) References Cited

U.S. PATENT DOCUMENTS

| | | | |
|---|---|---|---|
| 4,289,118 A * | 9/1981 | Stark | F24J 2/06 126/577 |
| 4,301,321 A | 11/1981 | Frederick | |
| 4,520,794 A | 6/1985 | Stark et al. | |
| 5,899,199 A | 5/1999 | Mills | |
| 6,131,565 A | 10/2000 | Mills | |
| 6,818,818 B2 | 11/2004 | Bareis | |
| 6,959,993 B2 | 11/2005 | Gross et al. | |
| 8,026,440 B1 | 9/2011 | Gordon | |
| 8,063,300 B2 | 11/2011 | Jorne et al. | |
| 8,153,886 B1 | 4/2012 | Garboushian et al. | |
| 8,247,685 B2 | 8/2012 | Hunter et al. | |
| 8,336,539 B2 | 12/2012 | Linderman et al. | |
| 8,546,681 B2 | 10/2013 | Wares et al. | |
| 8,604,404 B1 | 12/2013 | Linderman et al. | |
| 2010/0071683 A1 | 3/2010 | Selig et al. | |
| 2010/0218807 A1* | 9/2010 | Arbore | F24J 2/07 136/246 |
| 2010/0229852 A1* | 9/2010 | Buckley | F24S 10/45 126/652 |
| 2010/0319684 A1 | 12/2010 | Almogy et al. | |
| 2011/0017267 A1 | 1/2011 | Lichy et al. | |
| 2011/0180059 A1 | 7/2011 | Selig et al. | |
| 2011/0220094 A1 | 9/2011 | Mills et al. | |
| 2013/0112237 A1 | 5/2013 | Almogy et al. | |
| 2013/0239948 A1* | 9/2013 | Selig | F24J 2/07 126/595 |
| 2014/0000705 A1 | 1/2014 | Sounni et al. | |
| 2014/0076380 A1 | 3/2014 | Kalus et al. | |
| 2014/0196764 A1 | 7/2014 | Clavelle et al. | |

FOREIGN PATENT DOCUMENTS

| | | |
|---|---|---|
| EP | 1715260 | 11/2010 |
| EP | 1754942 B1 | 5/2011 |
| EP | 2282976 B1 | 4/2013 |

* cited by examiner

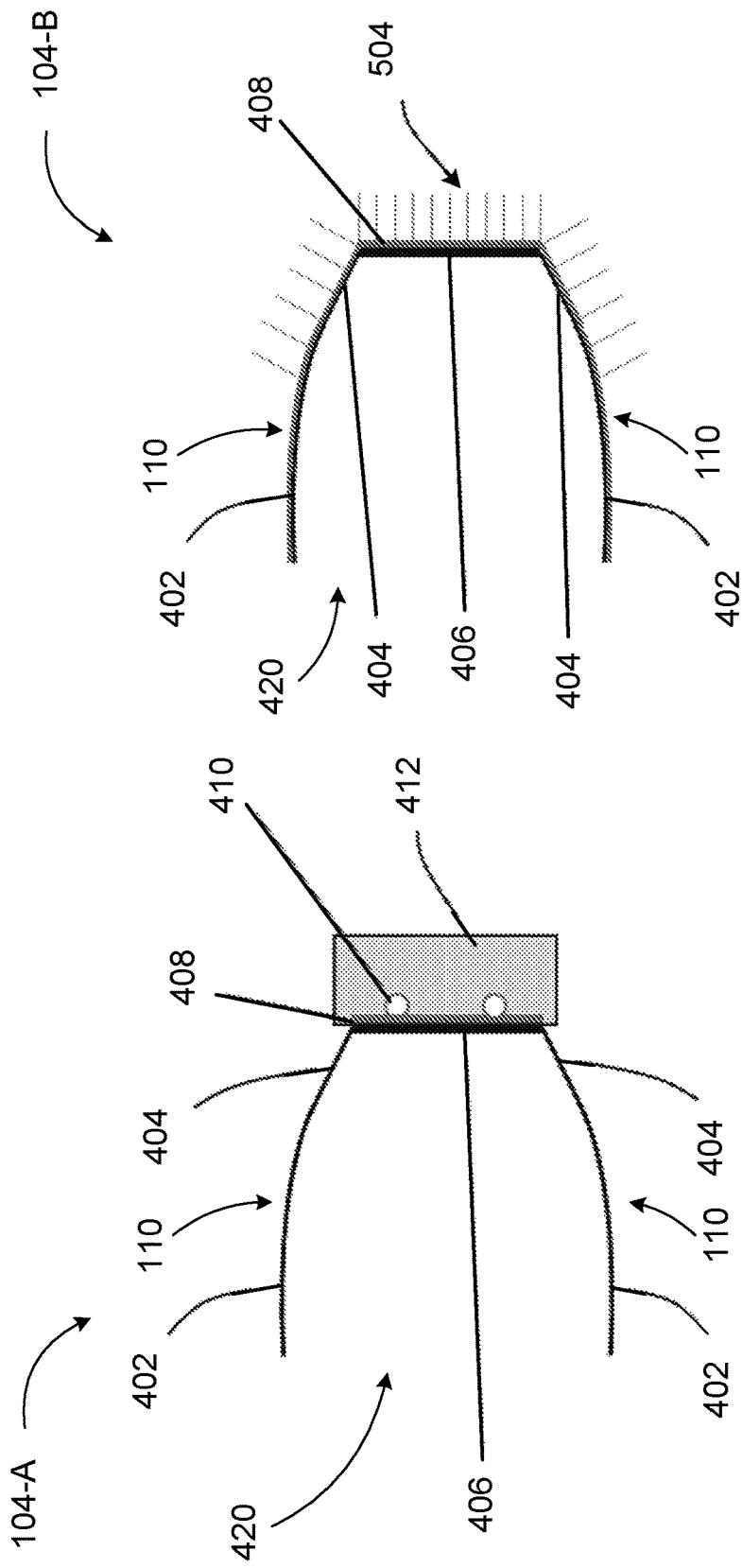

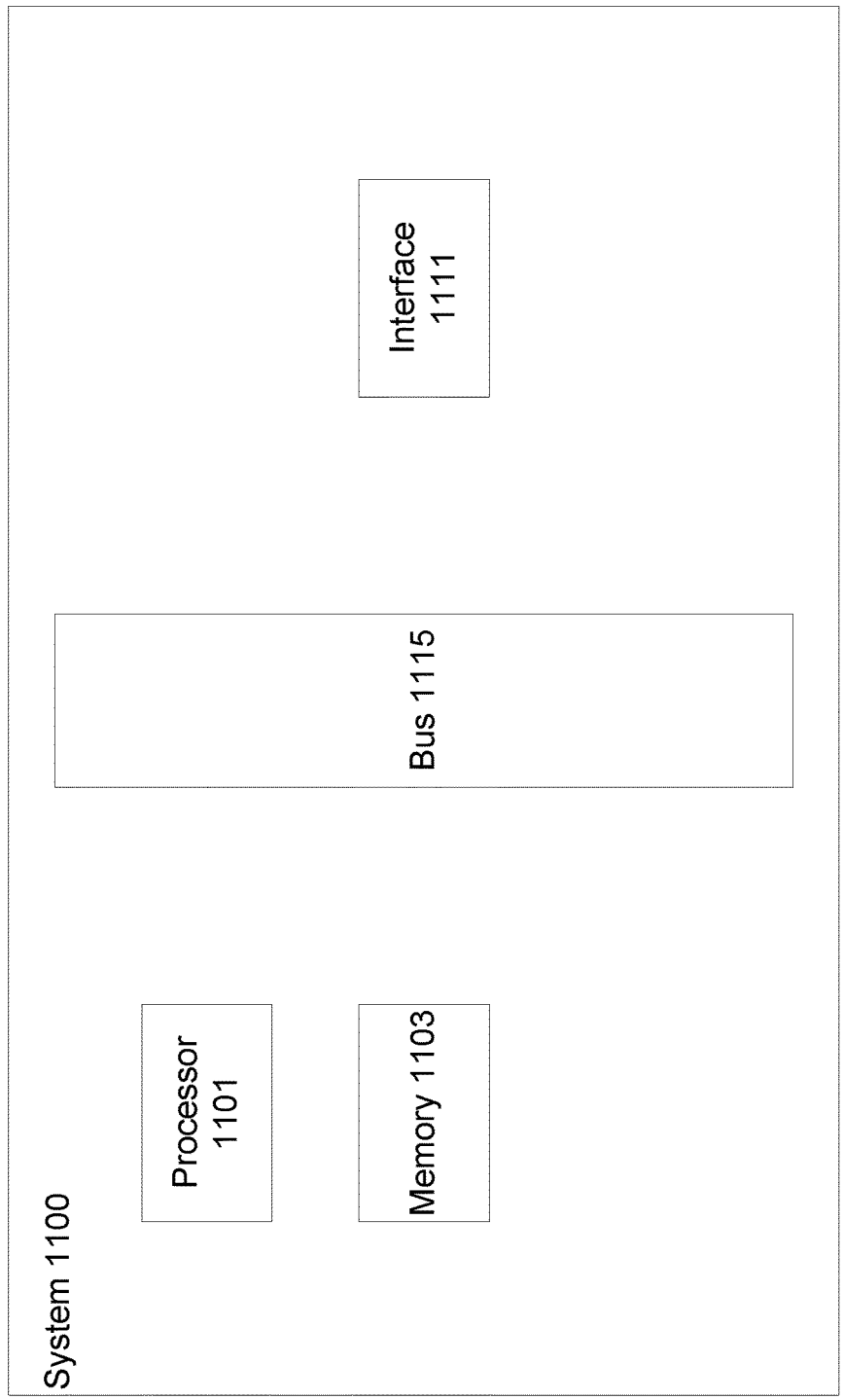

SYSTEMS AND METHODS FOR COLLECTING SOLAR ENERGY USING A TILTED LINEAR SOLAR COLLECTOR

CROSS-REFERENCE TO RELATED APPLICATIONS

This application claims priority under 35 U.S.C. § 119(e) to U.S. Provisional Application No. 62/265,163, filed Dec. 9, 2015, entitled TILTED LINEAR SOLAR COLLECTOR, the contents of which are hereby incorporated by reference.

TECHNICAL FIELD

The present disclosure relates generally to solar energy collection systems, and more specifically to an apparatus and method to concentrate light for the purposes of generating electricity, heating a fluid, or both generating electricity and heating a fluid simultaneously.

BACKGROUND

Concentrating photovoltaic (CPV) solar energy systems use reflectors or lenses to focus sunlight on photovoltaic solar cells, which generate electric power. By utilizing a light concentration system, the area of photovoltaic cells can be significantly reduced but still generate the same amount of power relative to a photovoltaic system without light concentration. Since a small amount of photovoltaic cell material is used, then more efficient but more costly photovoltaic cells can be economically used since they are a smaller fraction of the system's total capital cost.

Existing systems may also use single-axis tracking systems where the tracking axis is parallel to the Earth's surface. For sites far from the equator, collector systems with this type of tracking system will concentrate light much more efficiently during the summer than winter because of the significant difference in the sun's path through the sky between the seasons. Therefore, the average daily production in the summer will be much higher than the average daily production in the winter, and therefore producing a very uneven seasonal energy output. The peak hourly output will also be much higher than the annual hourly average. An uneven seasonal energy output results in limitations on system integration. A solar energy system is frequently sized based upon the peak hourly output observed in a typical meteorological year. A solar energy system with an uneven seasonal energy output would therefore deliver less energy throughout the year for a fixed peak versus a system with a more uniform energy output.

SUMMARY

Provided are various mechanisms and processes relating to generating synthetic stereo pairs of images using monocular image sequences. In one aspect, which may include at least a portion of the subject matter of any of the preceding and/or following examples and aspects, a solar collector device is provided. The solar collector device comprises a receiver assembly mounted on a frame structure. The receiver assembly comprises one or more secondary concentrators and a heat transfer tube. The solar collector device further comprises one or more primary reflectors. Each primary reflector comprises a flat elongated mirror mounted on a structural backing. The structural backing is rotatably coupled to the frame structure such that each primary reflector may pivot around a pivot axis. The one or more primary reflectors reflect light focused upon the receiver assembly such that heat energy from the reflected light is transferred to a heat transfer fluid flowing through the heat transfer tube.

The solar collector device is positioned such that the pivot axes of the one or more primary reflectors are aligned from north to south, wherein the one or more primary reflectors are tilted toward the equator at an angle that matches the latitude angle of the latitudinal location of the solar collector device. The one or more primary reflectors may be linked together and rotated at a constant speed based on the location of the sun. The one or more primary reflectors are rotated by mechanical means. The receiver assembly translates along the frame structure in a direction that is parallel to the pivot axes of the one or more primary reflectors.

The receiver assembly may further comprise a photovoltaic panel coupled to the heat transfer tube by a conductive plate. The conductive plate and the heat transfer tube may be enclosed in a thermally insular material. The heat transfer tube may be positioned at the center of the receiver assembly and the secondary concentrators are positioned around the heat transfer tube opposite the one or more primary reflectors. The solar collector device may further comprise a transparent outer tube located around the heat transfer tube, such that an annular space is formed between the outer tube and the heat transfer tube. The solar collector may comprise a plurality of receiver assemblies, wherein the plurality of receiver assemblies are positioned symmetrically relative to the one or more primary reflectors.

Other implementations of this disclosure include systems and processes corresponding to the solar collector device. For instance, a method for collecting solar energy is provided. The method comprises rotating one or more primary reflectors around one or more pivot axes. Each primary reflector comprises a flat elongated mirror mounted on a structural backing that is rotatably coupled to a frame structure such that each primary reflector may rotate around a corresponding pivot axis. The one or more primary reflectors may be linked together and rotated at a constant speed based on the location of the sun. The one or more primary reflectors may be rotated by mechanical means.

The method further comprises positioning the frame structure such that the one or more pivot axes of the one or more primary reflectors are aligned from north to south and tilting the one or more primary reflectors toward the equator at an angle that matches the latitude angle of the latitudinal location of the one or more primary reflectors.

The method further comprises reflecting light focused from the one or more primary reflectors upon a receiver assembly mounted on the frame structure. The receiver assembly comprising one or more secondary concentrators and a heat transfer tube. In some embodiments, the receiver assembly may further comprise a photovoltaic panel coupled to the heat transfer tube by a conductive plate. The conductive plate and the heat transfer tube may be enclosed in a thermally insular material. In other embodiments, the heat transfer tube may be positioned at the center of the receiver assembly and the secondary concentrators are positioned around the heat transfer tube opposite the one or more primary reflectors. A transparent outer tube may be located around the heat transfer tube, such that an annular space is formed between the outer tube and the heat transfer tube.

The method further comprises translating the receiver assembly along the frame structure in a direction that is parallel to the one or more pivot axes of the one or more primary reflectors. The method further comprises transferring heat energy from the reflected light to a heat transfer fluid flowing through the heat transfer tube.

These and other embodiments are described further below with reference to the figures.

BRIEF DESCRIPTION OF THE DRAWINGS

The disclosure may best be understood by reference to the following description taken in conjunction with the accompanying drawings, which illustrate particular embodiments of the present disclosure.

FIG. 4 illustrates a detailed end-on view of one embodiment of a receiver assembly.

FIG. 5 illustrates a detailed end-on view of a second embodiment of a receiver assembly.

FIG. 11 is a block diagram illustrating an example of a system 1100 capable of implementing various processes described in the present disclosure.

DETAILED DESCRIPTION

Figure 1:
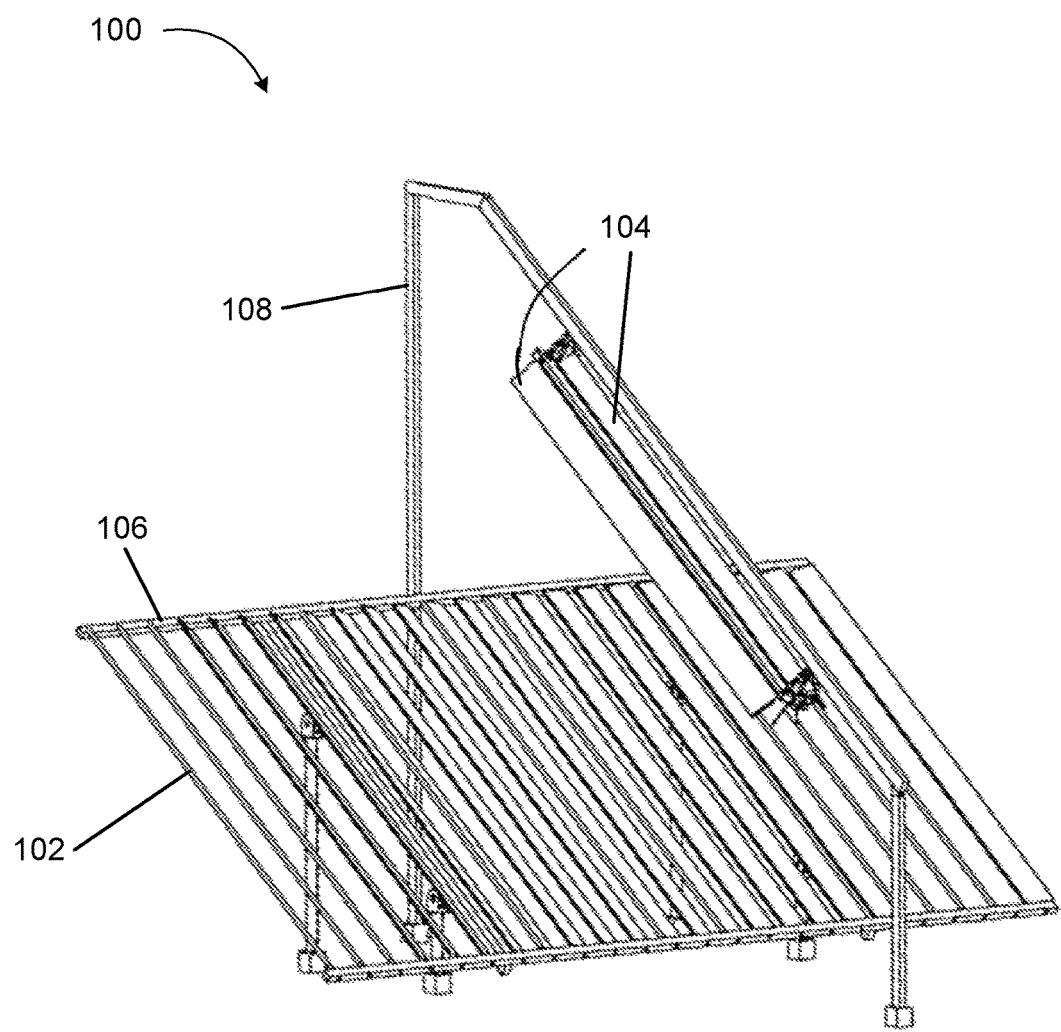
FIG. 1 illustrates a perspective view of an example of a solar collector, in accordance with one or more embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting. On the contrary, it is intended to cover alternatives, modifications, and equivalents as may be included within the spirit and scope of the present disclosure as defined by the appended claims.

For example, the techniques of the present disclosure will be described in the context of particular energy uses, such as water heating. However, it should be noted that the techniques and mechanisms of the present disclosure apply to various other energy uses, such as process heat addition, water desalination, electrical power generation, etc. In the following description, numerous specific details are set forth in order to provide a thorough understanding of the present disclosure. Particular example embodiments of the present disclosure may be implemented without some or all of these specific details. In other instances, well known process operations have not been described in detail in order not to unnecessarily obscure the present disclosure. Various techniques and mechanisms of the present disclosure will sometimes be described in singular form for clarity. However, it should be noted that some embodiments include multiple iterations of a technique or multiple instantiations of a mechanism unless noted otherwise.

Overview

The present disclosure describes an improved solar collector that concentrates solar energy and converts it into electricity, thermal energy, or electricity and thermal energy together. A number of elongated mirrors, called primary reflectors, are aligned with one another and track the sun about one axis to reflect light upon receivers. The receivers are comprised of side mirrors and a target. In one embodiment, the side mirrors further concentrate the reflected light onto a photovoltaic panel for electricity generation or for electricity plus heat generation by recovering excess heat from the back of the photovoltaic panel. In another embodiment, the mirrors in the receiver can be used to concentrate light onto a heat transfer tube for heat generation. The whole assembly of elongated mirrors and receivers is aligned in the north-south direction and tilted toward the equator for a better view of the sun. The receivers may translate along a line that is both in the north-south direction and in parallel to the elongated mirrors, to account for the changing direction of reflected light as the sun's arc through the sky changes with the seasons. In some embodiments, a cleaning machine is mounted to the assembly of primary reflectors to enable fast, reliable mirror cleaning.

Accordingly, by tilting the collector toward the equator, a more even output profile between different seasons is achieved versus a collector that is oriented parallel to the ground. Second, the collector design enables low-cost construction since the elongated mirrors are flat and are aligned in a way that minimizes wind loading. The receiver's side mirrors combined with the concentration of light enables low-precision optics, which leads to lower fabrication and construction costs. Further advantages will become apparent from a study of the following description and the accompanying drawings.

Example Embodiments

With reference to FIG. 1, shown is a perspective view of an example of a solar collector 100, in accordance with one or more embodiments. The solar collector 100 has a number of primary reflectors 102 that reflect light from the sun toward two receivers 104. In various embodiments, solar collector 100 may include any number of primary reflectors 102. As depicted in FIG. 1, solar collector system 100 includes 24 primary reflectors. However, in other embodiments, there could be as few as one, or more than 24, primary reflectors.

According to various embodiments, primary reflectors 102 can rotate about an axis. The axis may be referred to herein as the rotation axis or axis of rotation. In some embodiments, the axes of rotation of all of the primary reflectors 102 are aligned with one another, aligned with the receivers, and aligned in the north-south direction. Grouped together, the axes of rotation of all the primary reflectors may form a plane. Such plane may be tilted toward the equator. In various embodiments, the angle that the plane is tilted could be higher than 60° versus horizontal to as low as 0° tilt versus horizontal, i.e., parallel to the earth's surface. The embodiment shown in FIG. 1 features a tilt angle of 36° toward the equator and assumes that the solar collector is located at a site with a latitude of 36°. However, in other embodiments, the tilt angle does not need to match the latitude angle. In yet further embodiments, the solar collector could be used at any site from the equator to sites that are north of a latitude of 60° N and south of a latitude of 60° S. In some embodiments, the tilt angle of the primary reflectors 102 is set and does not change. In other embodiments, tilting the primary reflectors 102 may be adjusted manually. However, in other embodiments, the tilt angle of the primary reflectors 102 may be adjusted mechanically, such as by an actuator, which could be an electric motor, a pneumatic system, a hydraulic system, a manual system, or other actuation system.

As shown in FIG. 1, primary reflectors 102 are composed of flat mirrors mounted on a structural backing. In various embodiments, the mirrors may be glass mirrors, metallic mirrors, polymeric mirrors, or any other type of reflective material. The backing can be a metal or plastic frame, a metal stamped part, a composite material, or any other assembly that provides stiffness and strength. As depicted, the mirrors comprising primary reflectors 102 are flat, however such mirrors may be configured in various shapes in other embodiments. For example, such mirrors may be curved to allow larger primary reflector width versus receiver width or to cause a different distribution of reflected sunlight on the receivers in other embodiments.

In some embodiments, the primary reflectors are long in the dimension of their axis of rotation and narrow in the dimension perpendicular to the axis of rotation. Example dimensions could be 4 meters by 0.2 meters; however, the dimensions of the primary reflectors could be varied significantly without detrimental effect to the operation of solar collector 100.

The primary reflectors 102 are mounted on a frame structure 106 that supports them. This structure 106 can be mounted on the ground or on the top of a building or other structure. Structure 106 may also act to keep the primary reflectors 102 oriented properly while also allowing rotation of the primary reflectors 102. The embodiment shown in FIG. 1 features a structure that is 7 meters wide, although this dimension is merely an example and does not represent a design limitation.

Figure 6:
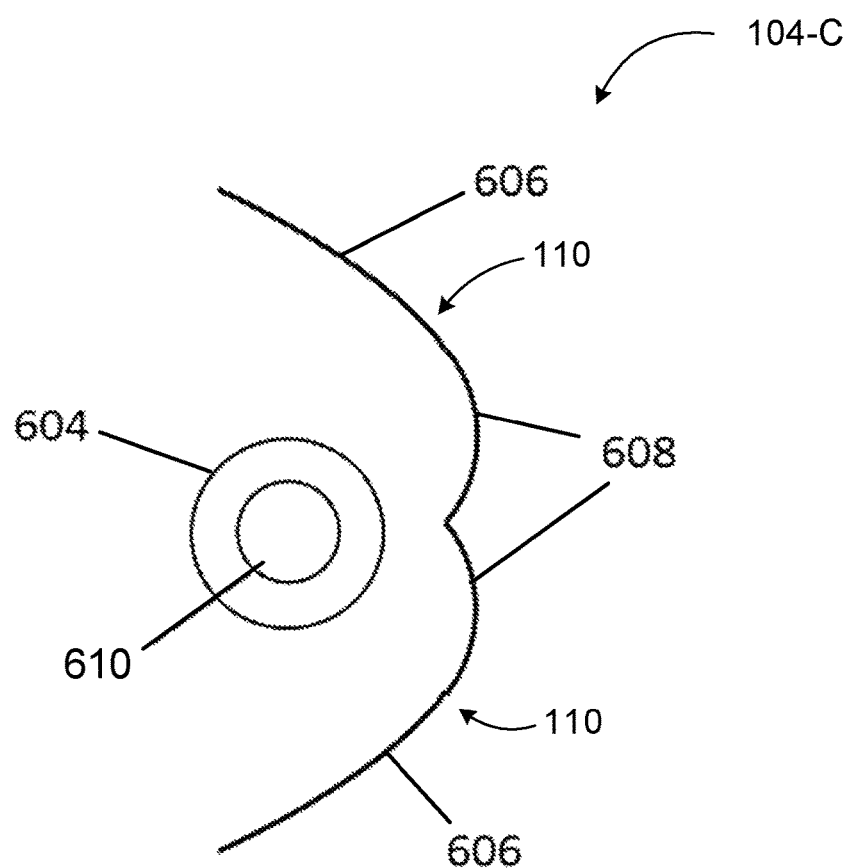
FIG. 6 illustrates a detailed end-on view of a third embodiment of a receiver assembly.

Receivers 104 are offset a distance from the plane formed by the axes of rotation of primary reflectors 102. This distance is approximately 2.3 m in this embodiment, but, in various embodiments, this dimension can be varied considerably without degrading operation. As depicted in FIG. 1, there are two receivers 104 that are each pointed at different halves of the group of primary reflectors 102. Alternatively, there may be a single receiver 104 pointed toward the center of the group of primary reflectors. In further embodiments, there may be three receivers 104. In such embodiments, one receiver 104 may point toward the center of the group of the primary reflectors 102, and the second and third receivers 104 would point toward either side of the group of primary reflectors 102. The distance between the primary reflectors 102 and the receivers 104 would change if the number of receivers 104 were changed or if a receiver 600, as depicted in FIG. 6, were used instead of the receiver 400 described with reference to FIG. 4. In various embodiments, one or more receivers 104 may be mounted on a support structure 108, which keeps them properly positioned about primary reflectors 102. In some embodiments, support structure 108 may be a portion of and/or coupled to frame structure 106.

Figure 2:
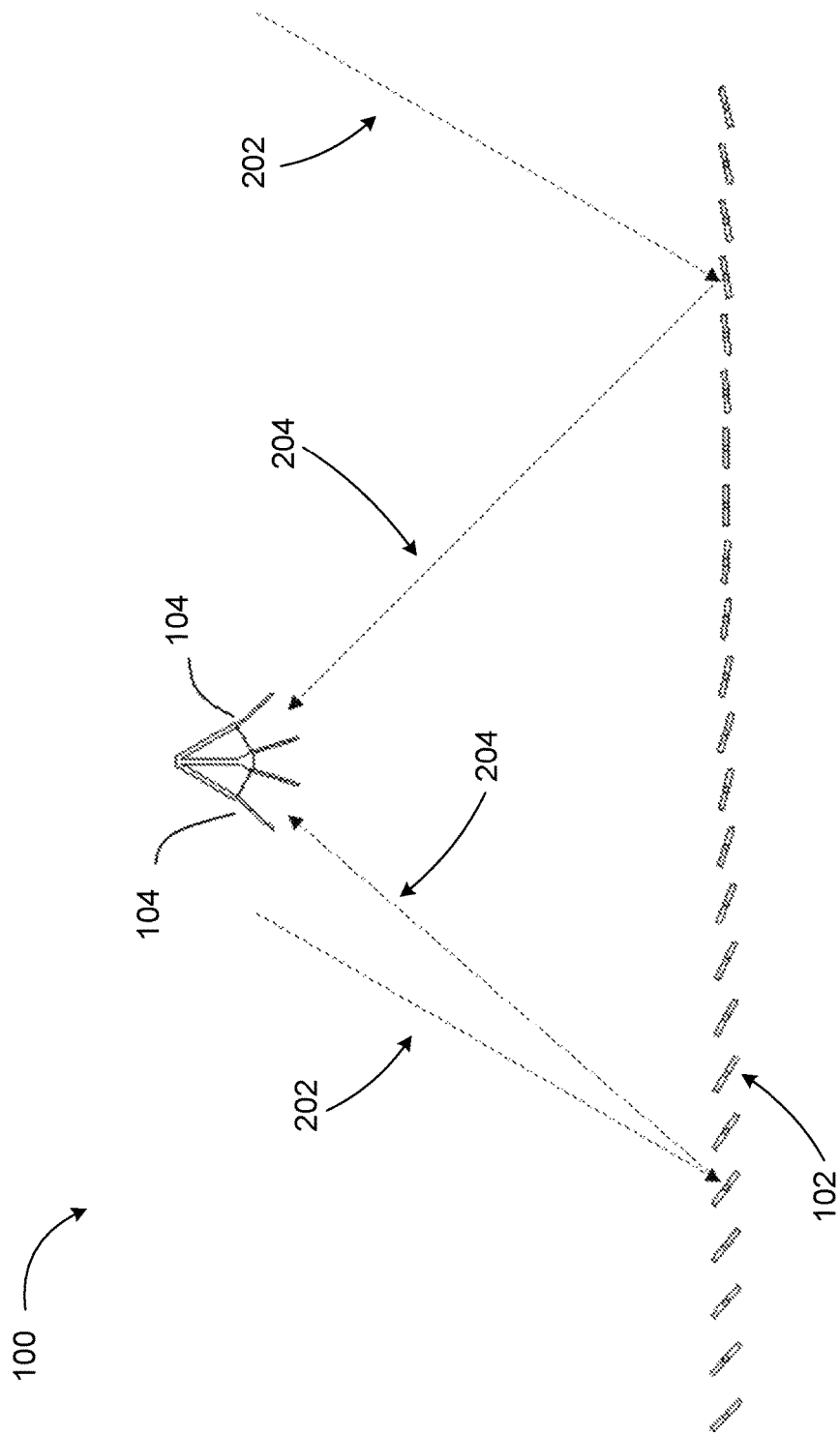
FIG. 2 illustrates a side view of the solar collector observed in line with the primary reflectors, in accordance with one or more embodiments.

FIG. 2 illustrates a side view of the solar collector 100 observed in line with the axes of rotation of primary reflectors 102, in accordance with one or more embodiments. In other words, the view depicted in FIG. 2 shows solar collector 100 from a view that is aligned with the plane of primary reflectors 102. Structural components, such as structures 106 and 108, are omitted from FIG. 2 for clarity of illustrative purposes. FIG. 2 depicts an example embodiment in which solar collector 100 is located at a latitude of 36° North, where the solar collector is tilted toward the Equator at 36°, and where the time and day are 10 am on the vernal equinox. The direct beam of the sun 202 is reflected by the primary reflectors 102, and reflected light 204 is directed to receivers 104. As shown in FIG. 2, the primary reflectors 102 are not rotated at the same angle at the same time. Instead, in various embodiments, the angle of each one is necessarily different to reflect light toward receivers 104. However, in some embodiments, the primary reflectors 102 all rotate at the same speed throughout each day. Thus, in some embodiments, primary reflectors 102 may be linked together and rotated by the same actuator (not shown), which could be an electric motor, a pneumatic system, a hydraulic system, a manual system, or other actuation system. In other embodiments, each primary reflector 102 may be rotated separately.

As previously described, in some embodiments, primary reflectors 102 are tilted at the latitude angle. Consequently, the speed of rotation required to track the sun may be held constant. In embodiments in which primary reflectors 102 move at a constant speed, they could be driven by a simple mechanical system powered by a spring, similar to a mechanical clock or a wind-up toy, by gravity-driven system, or by another simple mechanical energy storage system. Such a system may be manually reset each day. Consequently, it is possible to operate the solar collector with no electric power.

In other embodiments, a simple electric or other automated system could be used to control the primary reflector movement. Additionally, the speed of rotation may instead be varied at times to improve the distribution of reflected sunlight on the receiver.

In some embodiments, primary reflectors 102 may be automatically rotated based time data, astronomical data, and/or location data. For example, a map, a global position system (GPS), or other geolocation device may be used to determine the location of solar collector 100. Astronomical data including the position of the sun relative to the earth may then be retrieved from various databases. Such databases may include global databases accessed through a global network. In other embodiments, such databases may be local databases stored locally in memory. Such information may be processed to determine the optimal rotation for each primary reflector 102. In further embodiments, solar collector 100 may include a light sensor which may be operable to detect the source of light relative to the sensor (and thus, relative to solar collector 100). By tracking the light source and determining the necessary angle of reflection for each primary reflector, the optimal rotation position for each primary reflector may be determined.

In some embodiments, the tilting of the primary reflectors 102 may also be automatically determined and/or controlled based on time data, astronomical data, location data (such as GPS), and/or various sensors, as described. In some embodiments, an actuator may be configured to raise or lower the frame structure 106 and/or the support structure 108 to an optimal angle based on such information.

Figure 3A:
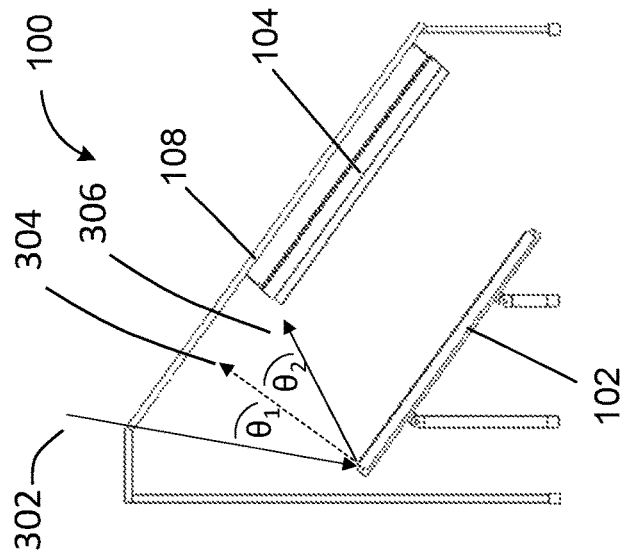
FIGS. 3A-3C illustrate a side view of the solar collector, adjusted for operation during various seasonal times of the year, in accordance with one or more embodiments.
Figure 3B:
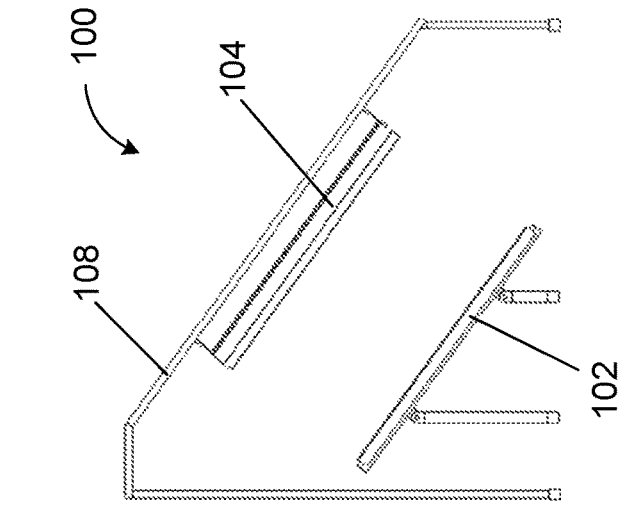
Figure 3C:
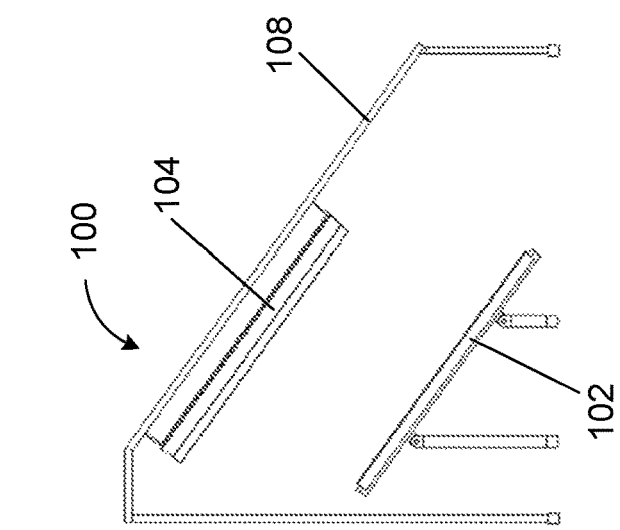

FIGS. 3A-3C illustrate a side view of solar collector 100, adjusted for operation during various seasonal times of the year, in accordance with one or more embodiments. FIG. 3A illustrates a side view of the solar collector system, adjusted for operation during the winter solstice. FIG. 3B illustrates a side view of the solar collector system, adjusted for operation during the vernal and autumnal equinoxes, in accordance with one or more embodiments. FIG. 3C illustrates a side view of the solar concentrator system in FIG. 1, adjusted for operation during the summer solstice, in accordance with one or more embodiments. In various embodiments, the length of receivers 104 may be equal to the length of primary reflectors 102. However, in other embodiments, the length of receivers 104 may be shorter or longer than the length of primary reflectors 102.

According to various embodiments, receivers 104 may translate along support structure 108 in the direction that is parallel to the axes of rotation of primary reflectors 102. Both receivers 104 may move together. In some embodiments, receivers 104 may be moved very slowly throughout the year to adjust for the changing direction of the reflected light from primary reflectors 102 as the sun's path through the sky changes during the seasons. In the present example embodiment, the total travel from summer position to winter position comprises a translation distance of approximately 2.4 meters. However, in other embodiments, this translation value would vary depending on choices for other dimensions. In some embodiments, the axes of rotation for primary reflectors 102 remain parallel to support structure 108 and receivers 104.

In various embodiments, the movement of the receivers 104, as depicted in FIG. 3A, 3B, and 3C, could be done by a pulley system, with a ball screw system, or with another mechanism. The movement may be powered by an electric system, by a pneumatic system, by a hydraulic system, or by another power system appropriate for automatic control. In other embodiments, movement of receivers 104 may be done with a manual system since the required adjustment could be done perhaps once every few days without a significant loss in optical efficiency. In other embodiments, the optimal translation position of the receivers 104 may be automatically determined and/or controlled based on time data, astronomical data, location data (such as GPS), and/or various sensors, as previously described with reference to the rotation of primary reflectors 102.

In some embodiments, the optimal translation position of the receivers 104 may be automatically determined and/or controlled based on time data, astronomical data, location data (such as GPS), and/or various sensors, as previously described with reference to the rotation of primary reflectors 102. As previously described, the frame structure 106 and/or support structure 108 may be adjusted to various tilt angles, manually or mechanically. In such embodiments, in which the tilt angle is adjusted, translation of the receivers 104 may not be necessary to optimize the light reflected upon receivers 104.

By including a translating receiver 104, solar collector 102 may provide adequate light reflection and concentration without the need for varying the tilt angle. For example, where solar collector 100 is tilted at an angle equal to the latitude angle, primary reflectors 102 and receivers 104 are parallel to the axis of rotation of the Earth. The sun vector projected into the plane formed by the North-South and zenith axes 302 and the normal vector of the primary reflector projected into the same plane 304 form an angle θ1. For the case where primary reflectors 104 are aligned with the rotational axis of the Earth, this angle θ1 remains constant throughout each day of the year. Furthermore, the angle θ2 formed by the projection of the reflected light vector 306 and the primary reflector normal vector 304 also remains constant throughout the day.

On any given day, light reflected on a particular spot on a primary reflector 102 will be reflected to a constant lengthwise location on the plane of the receiver 104 since the receiver 104 is also aligned with the axis of rotation of the Earth and with the primary reflector 102. From one day to the next, the position of the Earth relative to the sun changes. The angle θ1 between the projection of the sun vector 302 and primary reflector normal vector 304 therefore changes, and the lengthwise location of the reflected light on the receiver 104 also changes. In some embodiments, the receiver 104 may slide throughout the seasons to accommodate this change. In some embodiments, the tilt angle would have to be adjusted drastically and often throughout a given day to achieve the same level of light reflection and concentration. As a result, solar collector 100 may be configured using fewer moving parts and may operate with less movement, which not only reduces the cost of production, but also reduces the opportunity for mechanical failure.

The light reflected by a primary reflector 102 projects a long narrow reflection along the receiver plane. In some embodiments, those primary reflectors 102 further from the center of the solar collector 100 project a longer reflection than the ones closer to the center of the solar collector 100 such that the length of the reflected light is longer than the receiver. Some spillage off the ends of the receiver may be an accepted efficiency loss in certain embodiments.

The translating receiver 104 configuration described herein may also compensate for a less precise tilt angle of solar collector 100. For example, in some instances, the tilt angle may not be equal to the latitude angle. In such cases, the angles θ1 and θ2 from FIG. 3C will not be constant throughout the day, and the receiver may slide during each day to account for the changing lengthwise position of the reflected light on the plane of the receiver. Although not depicted in FIGS. 3A and 3B, the angles and vectors described above with reference to FIG. 3C also correspond and apply to FIGS. 3A and 3B.

FIGS. 4-6 illustrate detailed end on views of various embodiments of a receiver assembly. FIG. 4 illustrates a detailed end-on view of one embodiment of a receiver assembly 104-A. In some embodiments, receiver assembly 104-A may be receiver 104. FIG. 4 depicts a receiver 104-A designed for combined heat and power generation. Light reflected from primary reflectors 102 may enter an aperture 420 defined by mirrors 110 on two sides (secondary concentrators) and a photovoltaic (PV) panel 406 in the center at the back of the receiver opening 420. In various embodiments, photovoltaic panel 406 converts light to electricity. The efficiency of electricity generation may depend on the choice of photovoltaic panel 406 and other factors. For example, if the PV panel 406 is 20% efficient and if 8% of the incident light is reflected, then 72% of the light may be converted to heat. In the receiver design depicted in FIG. 4, most of this heat may be used to heat a liquid that is conveyed through heat transfer tubes 410 located behind the PV panel 406. Although two tubes 410 are shown in FIG. 4, one or more tubes 410 could be used in other embodiments.

In various embodiments, a highly thermally conductive plate 408 may be located between PV panel 406 and tubes 410 to convey heat laterally from the back side of PV panel 406 to the tubes 410. In some embodiments, a highly thermally conductive paste may be used instead. In other embodiments, instead of comprising heat transfer tubes 410, flow channels may be integrated into conductive plate 408. PV panel 406 and tubes 410 may be put in good thermal contact with conductive plate 408. Alternatively, conductive plate 408 may be omitted in embodiments where PV panel 406 may be constructed to be sufficiently thermally conductive. In some embodiments, insulation 412 may be located behind heat transfer tubes 410 and thermally conductive plate 408 to reduce heat loss to the environment. In some embodiments, insulation may fully enclose conductive plate 408 and/or heat transfer tubes 410.

Also shown in FIG. 4, the side mirrors 110, also called secondary concentrators, may serve to provide a wider target for the reflected light from primary reflectors 102. Secondary concentrators 110 may also serve to flatten the distribution of concentrated solar flux on photovoltaic panel 406. In some embodiments, secondary concentrators 110 each comprise two segments. As depicted in FIG. 4, secondary concentrators 110 include a parabolic shaped mirror segment 402 nearer to the opening 420. A flat mirror segment 404 is located between the parabolic shaped segment 402 and photovoltaic panel 406. In some embodiments flat mirror segments 404 may restrict the angle of incidence of light upon the photovoltaic panel 406 to a maximum value, such as 60°, since photovoltaic panel efficiency tends to fall at high angle of incidence. The two-stage secondary concentrator 110 shown in FIG. 4 is one embodiment. In other embodiments, secondary concentrator 110 may be composed entirely of parabolic shaped mirrors, composed entirely of flat mirrors, composed of mirrors of other shapes such as elliptical or hyperbolic, or any combination thereof.

FIG. 5 illustrates a detailed end-on view of a second embodiment of a receiver assembly 104-B. In some embodiments, receiver assembly 104-B may be receiver 104. FIG. 5 shows a receiver embodiment designed for electricity generation only. As depicted, the mechanism of light capture in this embodiment is identical to that of the embodiment in FIG. 4. However, in FIG. 5, the heat dissipation mechanism is different. As described in FIG. 4, a two-stage secondary concentrator 110 further concentrates light on a photovoltaic panel 406. In some embodiments, excess heat is dissipated to the atmosphere by fin heat sinks 504, or other similar structures or devices that can efficiently transfer heat from a solar panel to ambient air. Receiver assembly 104-B may also include a conductive plate 408 which may transfer heat from the PV panel 406 to the fin heat sinks 504. As such, PV panel 406 and fin heat sinks 504 may be put in good thermal contact with conductive plate 408.

FIG. 6 illustrates a detailed end-on view of a third embodiment of a receiver assembly 104-C. In some embodiments, receiver assembly 104-C may be receiver 104. FIG. 6 shows a receiver embodiment designed for heat generation only. The receiver design depicted in FIG. 6 features secondary concentrators 110 composed of two different mirror shapes. The outer portion 606 of the mirrors 110 is in the shape of a parabola. The inner portion 608 is in the shape of an involute of a circle. In other embodiments, other mirror shapes may be used as well. A heat transfer tube 610 is located in the center of the receiver assembly 104-C, and the light is focused on this tube. A heat transfer fluid flows in the heat transfer tubes, and the fluid rises in temperature as a result of heating by the concentrated sunlight. In various embodiments, the heat transfer fluid may be water. In other embodiments, the heat transfer fluid may comprise any fluid that meets the specific requirements and/or temperature performance of an application, such as an antifreeze mixture for freeze protection, such as ethylene glycol or propylene glycol. In various embodiments, different factors may be considered for the type of heat transfer fluid, such as specific heat capacity, thermal conductivity, temperature range, and toxicity. For example, for a nontoxic freeze protection, propylene glycol may be selected. However, for even lower temperatures, ethylene glycol may be selected if toxicity is not an issue. In warmer climates, water may be adequate as freeze protection.

In some embodiments, a transparent tube 604 may be located around heat transfer tube 610 forming an annular space between transparent tube 604 and heat transfer tube 610. This transparent tube 604 acts to reduce heat loss from the heat transfer tube 610. In some embodiments, the annular space between heat transfer tube 610 and transparent tube 604 can be evacuated to reduce heat transfer further between the two tubes. This receiver geometry depicted in FIG. 6 may allow for a wider acceptance angle of light relative to the receiver designs in FIGS. 4 and 5. This may allow receiver 104-C may be positioned closer to the primary reflectors.

Figure 7:
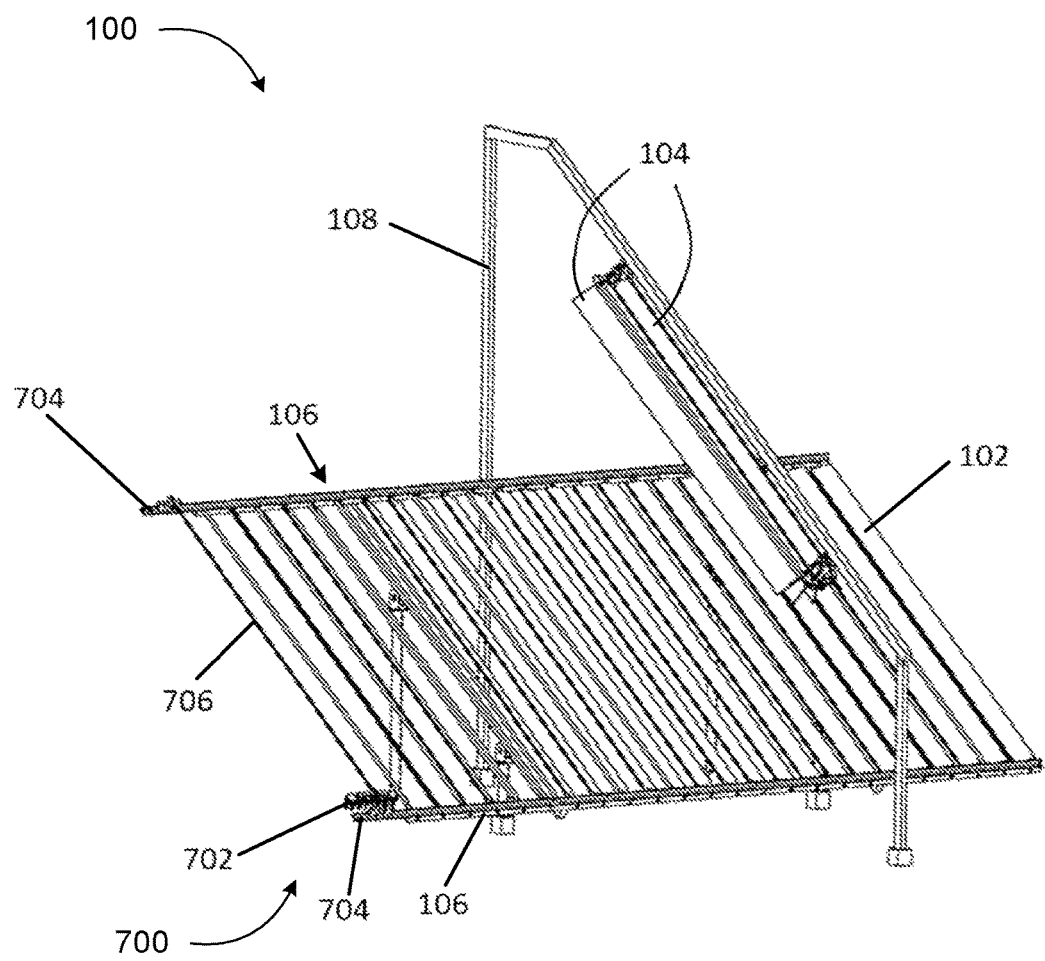
FIG. 7 illustrates a perspective view of an example of a solar collector with a mirror cleaning system, in accordance with one or more embodiments.
Figure 8:
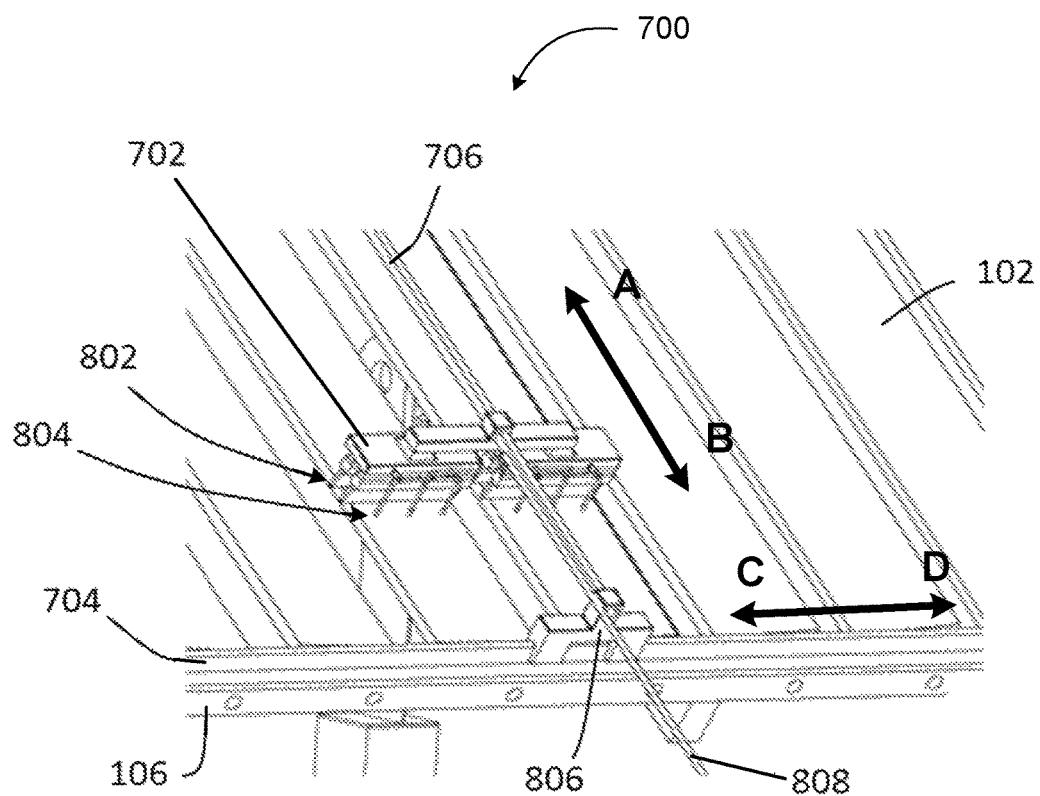
FIG. 8 illustrates a detailed perspective view of the mirror cleaning system, in accordance with one or more embodiments.

A mirror cleaning system 700 may be described with reference to the following FIGS. 7 and 8. FIG. 7 illustrates a perspective view of an example of a solar collector 100 with a mirror cleaning system 700, in accordance with one or more embodiments. The embodiment depicted in FIG. 7 differs from the one presented in FIG. 1 in that it includes a mirror cleaning system 100 comprising mirror cleaning machine 702, rails 704, and linear guide 706. FIG. 8 illustrates a detailed perspective view of the mirror cleaning system, in accordance with one or more embodiments.

In various embodiments, mirror cleaning machine 702 may be mounted on linear guide 706 that extends from one end of the primary reflectors 102 to the other end. Mirror cleaning machine 702 may move along linear guide 706 from one end of primary reflectors 102 to the other in the direction of arrows A and B. The linear guide 706 may be attached to two travelers 806, one at each end of the primary reflectors 102. The two travelers 806 may move laterally, in the direction of arrows C and D, relative to the frame structure 106 on two rails 704 that are mounted on the tops of the structural cross beams of frame structure 106. In some embodiments, this arrangement allows the mirror cleaning machine to move from one end of the primary reflectors 102 to the other end of the primary reflectors 102 to clean them.

In some embodiments, two mirrors are cleaned at a time, although one or more than two mirrors could be cleaned at a time in other embodiments. Once mirrors are cleaned, the mirror cleaning machine 702 along with the linear guide 706 and the travelers 806 may be moved laterally to the next mirrors to be cleaned. Continuing with FIG. 8, the mirror cleaning machine 702 depicted in this embodiment comprises two wipers 802 and a series of water pipes and nozzles 804. In various embodiments, the mirror cleaning machine 702 cleans the mirror by starting at the top of the primary reflectors 102, squirting water, or other cleaning fluid, onto the mirror surface, and then moving down the mirror along linear guide 706 toward the bottom, wiping the water and any soiling off the mirror with wipers 802 as it moves along. Once the mirror cleaning machine 702 reaches the bottom of the mirror, it may be moved to the next two mirrors, in either direction C or D, and then raised to the top along linear guide 706 to clean them. In some embodiments, cleaning machine 702 may include water pipes and nozzles 804 on either side of wipers 802 allowing cleaning machine 702 to clean the mirrors of primary reflectors 102 when moving in either direction A or B.

Although two wipers 802 per mirror are shown in FIG. 8, one or more than two may be included in various embodiments of mirror cleaning system 700. Similarly, while three water nozzles 804 per mirror are shown, fewer or more than three may be included in various embodiments. In some embodiments, a hose 808 supplies the mirror cleaning machine with water or other cleaning fluid. In various embodiments, the movement of mirror cleaning machine 702 can be powered by manual means, by electric motors and a pulley system, by water power, by pneumatics, by a combination of the aforementioned methods, or by any other means.

In various embodiments, solar collector 100 provides several advantages, described below without limitation. Solar collector 100 is low cost and simple to operate and that it generates a more uniform seasonal energy output profile. Because of the efficient concentration of light by the disclosed configurations, the photovoltaic panel area required may also be less than one tenth what would be required for a non-concentrating photovoltaic system. This also results in more efficient and consistent heat energy collection throughout the year. By tilting solar collector 100 toward the equator, the output between winter and summer is significantly more uniform compared with a horizontal system as well.

The primary reflectors 102 are flat and simple, and are configured to concentrate light to sufficient degree for many applications. In some embodiments, the configuration of primary reflectors 102 may provide the same or better light concentrations than other mirror configurations and shapes, such as parabolic or other curved shapes. However, they are thin and flat enough to be arranged such that wind loading is reduced, which reduces the requirements for their structural supports, such as 106 and 108. Flat mirrors are further simpler and cheaper to construct than curved mirrors.

The tracking mechanism can be simple since the primary reflectors all rotate at the same speed and, if tilted at the latitude angle, rotate at a constant speed through the day. In addition, including a sliding receiver 104 may allow solar collector 100 to be positioned at a fixed tilt angle throughout the year. This eliminates the need to drastically alter the tilt angle through the day to compensate for the movement of the sun. Such sliding receiver 104 may also compensate for less precise tilt angles. Such tracking mechanism may be performed by a simple mechanical energy storage system without electrical power, such as a spring, gravity-driven system, etc. However, the tracking mechanism may also be automated and implement wireless and GPS technologies to accurately determine the optimal angle to tilt solar collector 100, the optimal rotation for each primary reflector 102, and/or the optimal translation position for receiver assembly 104.

Figure 9A:
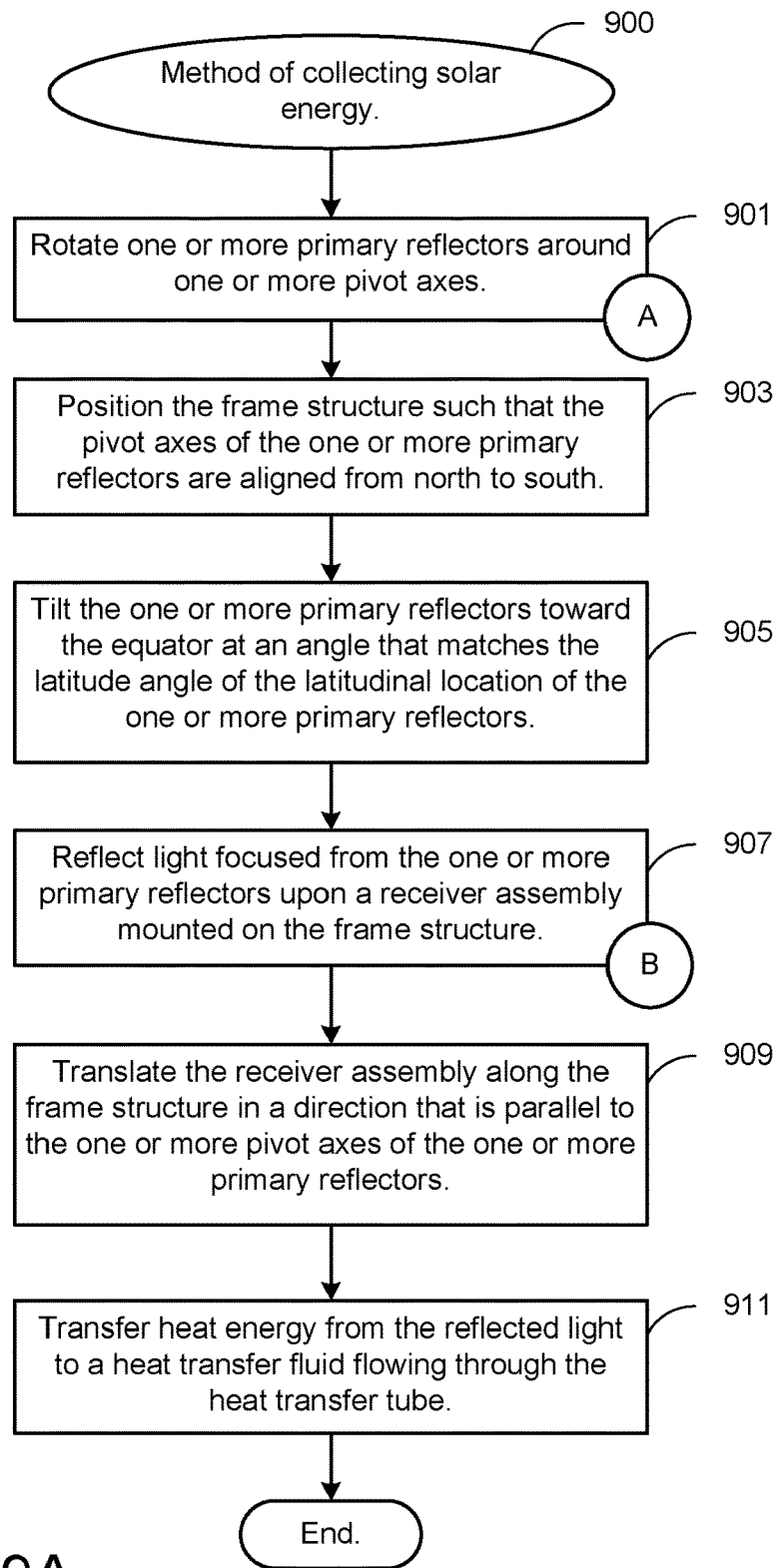
FIGS. 9A and 9B illustrate an example method 900 of collecting solar energy, in accordance with one or more embodiments.
Figure 9B:
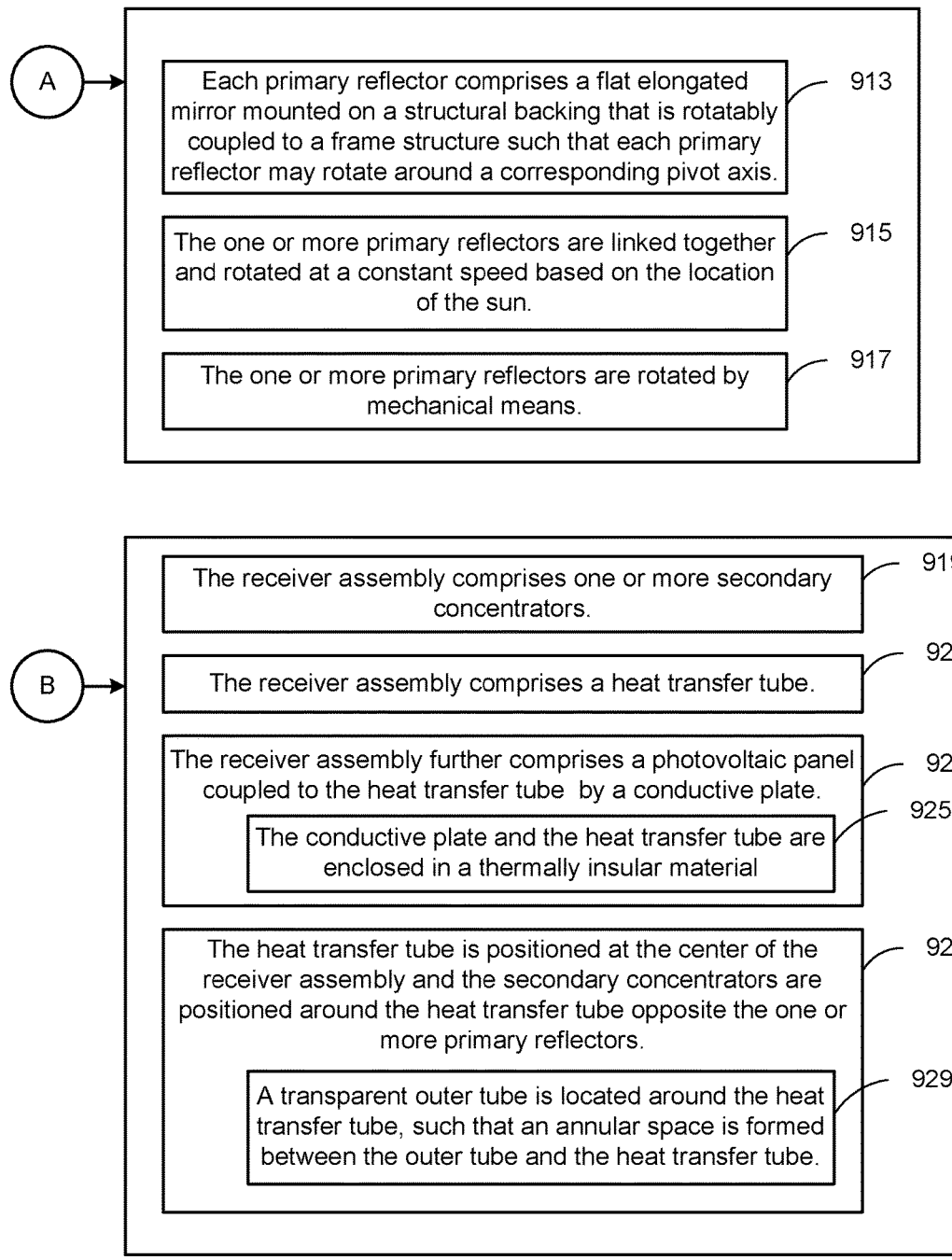

FIGS. 9A and 9B illustrate an example method 900 of collecting solar energy, in accordance with one or more embodiments. At step 901, one or more primary reflectors 913 are rotated around one or more pivot axes. In some embodiments, each primary reflector 913 comprises a flat elongated mirror mounted on a structural backing that is rotatably coupled to a frame structure such that each primary reflector 913 may rotate about a corresponding pivot axis. In some embodiments, primary reflectors 913 may be primary reflectors 102, the configuration of which are described with reference to FIGS. 1 and 2.

In some embodiments, the one or more primary reflectors are linked (915) together and rotated at a constant speed based on the location of the sun. In some embodiments, the rotation of the primary reflectors 913 about the pivot axes tracks the position of the sun through the day. In various embodiments, this may provide the optimal angle for reflection of sunlight from the primary reflector 913 to a receiver assembly, such as 104. As previously described with reference to FIG. 2, although the primary reflectors 913 may be linked (915), they may not necessarily all be positioned at the same rotation. The rotation position of a primary reflector 913 about a pivot axis may depend on the position of the primary reflector relative to the receiver assembly.

In some embodiments, the one or more primary reflectors 913 are rotated by mechanical means 917. As previously described, such mechanical means 917 may comprise an electric motor, a pneumatic system, a hydraulic system, a manual system, or other actuation system. As previously described, such rotation position of primary reflectors 913 may be automatically determined by time data, astronomical data, and/or location data (such as GPS).

Additional steps may be performed to further optimize the amount of light reflected upon a receiver assembly. At step 903 the frame structure is positioned such that the pivot axes of the one or more primary reflectors 913 are aligned from north to south. This may position align the pivot axes, such the one or more primary reflectors 913 are able to track the location of the sun by rotating about the pivot axes as described in step 901. At step 905, the one or more primary reflectors 913 are tilted toward the equator at an angle that matches the latitude angle of the latitudinal location of the one or more primary reflectors 913. As previously described, tilting the primary reflectors 913 toward the equator to match the latitude angle may further increase the amount of sunlight reflected by the primary reflectors 913. However, in other embodiments, the tilt angle does not need to match the latitude angle and may be tilted as low as 0° to higher than 60°.

At step 907, light focused from the one or more primary reflectors 913 is reflected upon a receiver assembly mounted on the frame structure. In some embodiments the receiver assembly may be receiver assembly 104, 104-A, 104-B, or 104-C. In some embodiments, the receiver assembly comprises one or more secondary concentrators 919. In some embodiments secondary concentrators 919 may be secondary concentrators 110. The receiver assembly may also comprise a heat transfer tube 921. In some embodiments, heat transfer tube 921 may be heat transfer tube 410 and/or 610.

In some embodiments, the receiver assembly may further comprise a photovoltaic panel 923 coupled to the heat transfer tube 921 by a conductive plate 925. In some embodiments, photovoltaic panel 923 may be photovoltaic panel 406, and conductive plate 925 may be conductive plate 408. In some embodiments, the conductive plate 925 and the heat transfer tube 921 are enclosed in a thermally insular material, such as insulation 412. In some embodiments, the photovoltaic panel 923 may also be partially or entirely enclosed in the thermally insular material. In some embodiments configured for electricity generation only, such as receiver assembly 104-B, the receiver assembly may not comprise a heat transfer tube 921. Instead, such embodiments of the receiver assembly may comprise heat sinks, such as fin heat sinks 504.

In various embodiments, the solar collector device 100 may be configured for heat generation only, such as described in FIG. 6. In such embodiments, the heat transfer tube 921 may be positioned at the center 927 of the receiver assembly and the secondary concentrators 919 are positioned around the heat transfer tube 921 opposite the one or more primary reflectors 913. In further embodiments, a transparent outer tube 929 may be located around the heat transfer tube 921, such that an annular space is formed between the outer tube 929 and the heat transfer tube 921. In some embodiments, the transparent outer tube 929 allows light to penetrate through to heat the heat transfer tube 921 while working to trap heat within the annular space. In some embodiments, the annular space may be evacuated to create a vacuum between the heat transfer tube 921 and the outer tube 929, thereby decreasing potential heat loss from the heat transfer tube 921. In various embodiments, the receiver assembly may comprise any combination of one or more of the following: secondary concentrators 919, heat transfer tube 921, photovoltaic panel 923, conductive plate 925, and insular material.

At step 909, the receiver assembly is translated along the frame structure in a direction that is parallel to the one or more pivot axes of the one or more primary reflectors 913, such as previously described with reference to FIGS. 3A-3C. Step 909 may be performed to further optimize the amount of light reflected upon a receiver assembly. As previously described, translating the receiver assembly may be automatically determined by time data, astronomical data, location data (such as GPS), and/or various sensors.

At step 911, heat energy from the reflected light is transferred to a heat transfer fluid flowing through the heat transfer tube 921. In various embodiments, the temperature of the heat transfer fluid may rise up to well over 200° C. In some embodiments, the maximum temperature generated may be limited by the construction of the photovoltaic panels 923, as the efficiency of photovoltaic cells in a photovoltaic panel 923 may decrease as temperature increases beyond a certain threshold. For example, a particular PV panel 923 may be rated to function at a max temperature of 85° Celsius.

In some embodiments, temperatures of 80° Celsius to 85° Celsius may be adequate to heat water for residential or commercial usage, desalination, industrial processes, and/or water treatment. However, in embodiments of solar collector 100 that are configured for heat generation only, there may be no such limit to the maximum temperature that can be reached. In some embodiments, heat generated by solar collector 100 may be used for steam generation. In other embodiments, other fluids may be heated for various commercial uses, such as brewing beverages, and/or various industrial process needs, such as separating crude oil from water or ethanol distillation.

Figure 10:
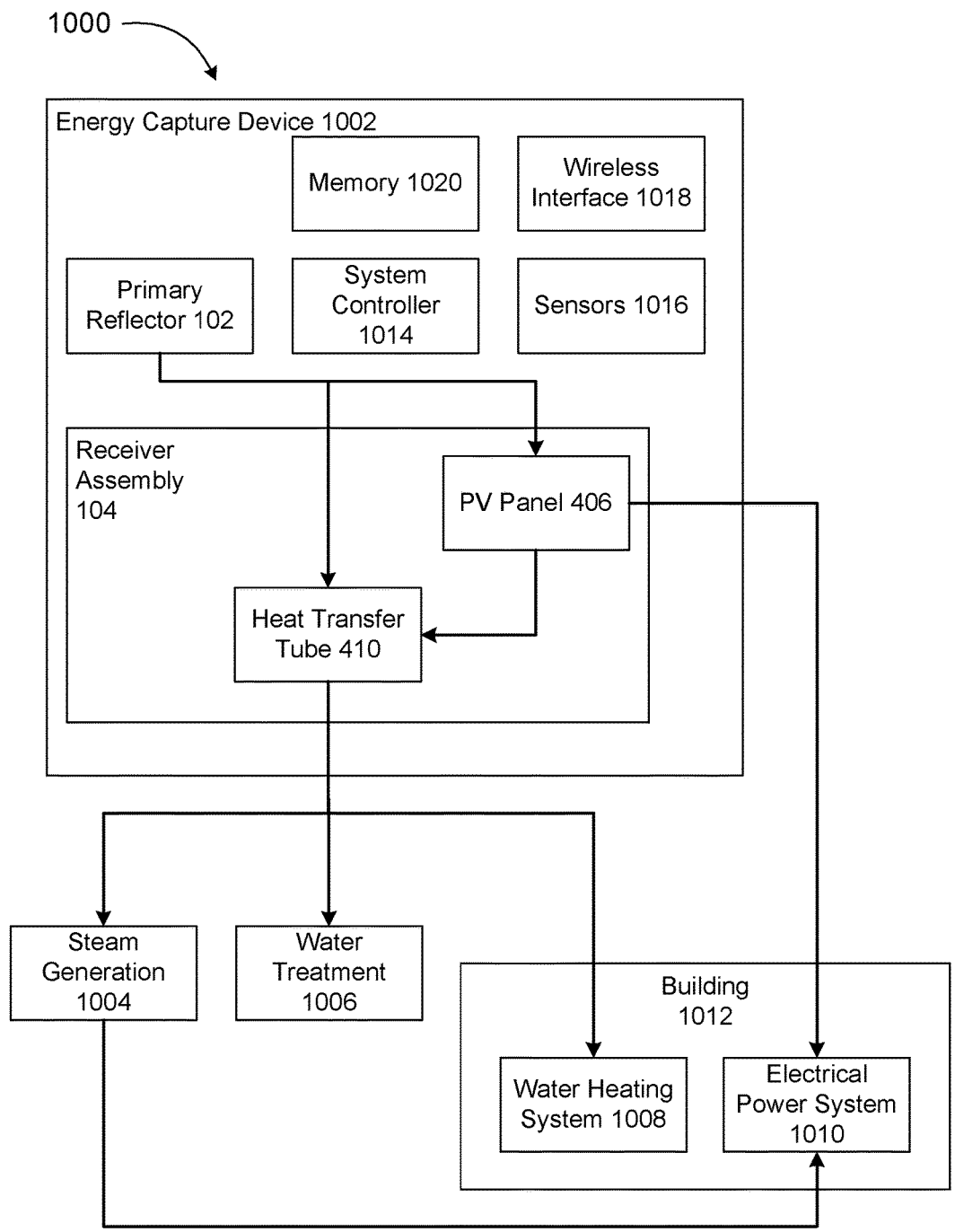
FIG. 10 illustrates an example energy collection system that can be implemented using various embodiments of the present disclosure.

FIG. 10 illustrates an example energy collection system 1000, in accordance with one or more embodiments. According to various embodiments, system 1000 may comprise an energy capture device 1002. In some embodiments energy capture device 1002 may be solar collector 100, which reflects sun sunlight from a primary reflector 102 upon a receiver assembly 104 to generate electricity and/or heat energy. As depicted in FIG. 10, light reflected from primary reflector 102 may be focused onto a heat transfer tube 410 and/or a photovoltaic panel 406 of receiver assembly 104. In some embodiments, heat transfer tube 410 may be heat transfer tube 610 in receiver assembly 104-C, which does not include any PV panels 406.

System 1000 may further comprise system controller 1014, sensors 1016, wireless interface 1018, and memory 1020. In various embodiments, sensors 1016 may include a light source detector, GPS or other geolocation device. In various embodiments, wireless interface 1018 may retrieve and/or receive data, from global databases over a global network, pertaining to relevant astronomical data, location data, and/or time data. In other embodiments, such data may be locally stored in memory 1020. In other embodiments wireless interface 1018 may wirelessly receive user input including instructions for adjusting the translation of receivers 104, the rotation of primary reflectors 102, and/or the tilt of primary reflectors 102. In various embodiments, system controller 1014 utilizes the information gathered by sensors 1016, wireless interface 1018, and memory 1020 to control the various movements of solar collector 100 to optimize light reflection.

Light focused onto photovoltaic panel 406 may then be converted into electrical energy by photovoltaic cells included in the photovoltaic panel 406. Such electrical energy may be transferred to the electrical power system 1010 of a building 1012, which may be residential or commercial. Light focused onto heat transfer tube 410 may be utilized to heat a heat transfer fluid, such as water or antifreeze. The heated heat transfer fluid may then be used to heat water at a water heating system 1008 for a building structure 1012. In some embodiments, energy capture device 1002 may be installed in building 1012, such as on the roof, or on land surrounding building 1012. In further embodiments, the heat transfer fluid may be used for water treatment 1006 and/or steam generation 1004. In some embodiments, all of the various processes may be performed by using a heat transfer fluid comprising glycol or other oil that is heated by solar collector 102, which can then be sent to a heat exchanger to heat the appropriate fluid for the particular process.

Steam generated by steam generation 1004 may be further used to generate electrical power for power system 1010. In various other embodiments, heat captured by energy capture device may be utilized for any of various processes that utilize heat. In various embodiments, the energy collection system 1000 may include one or more solar collectors 100. The amount of solar collectors 100 included may depend on the peak output of water of building 1012, desired use, and location. For example, the solar collector 100 as shown in FIG. 1 may generate 2.7 kW of electricity at peak output and 240 gal/day of 70° C. water. An average sized large hotel may require about seven solar collectors 100. A large restaurant may use one. Many more them in a very large application like a large water desalination system.

FIG. 11 is a block diagram illustrating an example of a system 1100 capable of implementing various processes described in the present disclosure. In some embodiments, system 1100 may be an energy capture device 1002, such as solar collector 100. In some embodiments, system 1100 may represent system controller 1014. According to particular embodiments, a system 1100, suitable for implementing particular embodiments of the present disclosure, includes a processor 1101, a memory 1103, an interface 1111, and a bus 1115 (e.g., a PCI bus or other interconnection fabric) and operates as a streaming server. In some embodiments, when acting under the control of appropriate software or firmware, the processor 1101 is responsible for processing sensor data, geolocation data, astronomical data, and/or time data to determine optimal positioning of various components of solar collector 100. In other embodiments, processor 1101 may also control signals from one or more control systems of various processes described with reference to FIG. 10, including steam generation 1004, water treatment 1006, water heating system 1008, and/or electrical power system 1010. In some embodiments, processor 1101 may receive and process signals from an inverter which converts the DC power of the photovoltaic cells to AC power for use in the grid. In other embodiments, the processor 1101 is responsible for receiving such relevant information from one or more databases. Various specially configured devices can also be used in place of a processor 1101 or in addition to processor 1101.

The interface 1111 is typically configured to send and receive data packets or data segments over a network, such as the Internet. Interface 1111 may also be configured to communicate with and control various device elements and components, such as actuators for moving the elements and components solar collector 100, as described with reference to FIGS. 9A and 9B. Particular examples of interfaces supports include Ethernet interfaces, frame relay interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management.

According to particular example embodiments, the system 1100 uses memory 1103 to store data and program instructions for operations including determining optimal rotation position for primary reflectors 102, determining optimal translation distance for receivers 104, determining optimal tilt angle for primary reflectors 102, and/or controlling various device elements and components. The program instructions may control the operation of an operating system and/or one or more applications, for example. In some embodiments, memory 1103 is memory 1020.

Because such information and program instructions may be employed to implement the systems/techniques described herein, the present disclosure relates to tangible, or non-transitory, machine readable media that include program instructions, state information, etc. for performing various operations described herein. Examples of machine-readable media include hard disks, floppy disks, magnetic tape, optical media such as CD-ROM disks and DVDs; magneto-optical media such as optical disks, and hardware devices that are specially configured to store and perform program instructions, such as read-only memory devices (ROM) and programmable read-only memory devices (PROMs). Examples of program instructions include both machine code, such as produced by a compiler, and files containing higher level code that may be executed by the computer using an interpreter.

Although many of the components and processes are described above in the singular for convenience, it will be appreciated by one of skill in the art that multiple components and repeated processes can also be used to practice the techniques of the present disclosure.

While the present disclosure has been particularly shown and described with reference to specific embodiments thereof, it will be understood by those skilled in the art that changes in the form and details of the disclosed embodiments may be made without departing from the spirit or scope of the disclosure. It is therefore intended that the disclosure be interpreted to include all variations and equivalents that fall within the true spirit and scope of the present disclosure.

What is claimed is:

1. A solar collector device comprising:
one or more primary reflectors, each primary reflector comprising an elongated mirror rotatably coupled to a first frame structure such that each primary reflector may rotate around a rotation axis, wherein each rotation axis of the one or more primary reflectors is tilted toward Earth's equator at a reflector angle; and
a receiver assembly comprising:
a second frame structure that is separate and uncoupled from the first frame structure, and
one or more elongated receivers, each receiver including a longitudinal axis that is tilted toward Earth's equator at a receiver angle, and each receiver comprising at least one of a heat transfer tube and a photovoltaic panel,
wherein each receiver translates along the second frame structure in a direction that is parallel to the respective longitudinal axis, wherein each receiver is mechanically translated by at least one of an electric pulley system and an electric ball screw system;
wherein the one or more primary reflectors reflect light onto the one or more receivers.

2. The solar collector device of claim 1, wherein the solar collector device is positioned such that the longitudinal axis of each receiver and the rotation axis of each of the one or more primary reflectors are aligned from north to south, and wherein the receiver assembly and the one or more primary reflectors are independently tilted toward Earth's equator.

3. The solar collector device of claim 1, wherein the one or more primary reflectors is a plurality of primary reflectors that are linked together and rotated at a same speed.

4. The solar collector device of claim 2, wherein the reflector angle and the receiver angle are different angles.

5. The solar collector device of claim 1,
wherein the receiver assembly comprises the heat transfer tube; and
wherein heat energy from the light reflected by the one or more primary reflectors is transferred to a heat transfer fluid flowing through the heat transfer tube.

6. The solar collector device of claim 1,
wherein the receiver assembly comprises a photovoltaic panel, and
wherein the light reflected by the one or more primary reflectors is focused onto the photovoltaic panel.

7. The solar collector device of claim 6,
wherein the receiver assembly further comprises the heat transfer tube thermally coupled to the photovoltaic panel, and
wherein heat energy from the light reflected by the one or more primary reflectors is transferred to a heat transfer fluid flowing through the heat transfer tube.

8. The solar collector device of claim 5, wherein the heat transfer tube is positioned at a center of the receiver assembly and one or more secondary concentrators are positioned around the heat transfer tube opposite the one or more primary reflectors.

9. The solar collector device of claim 8, further comprising a transparent outer tube located around the heat transfer tube, such that an annular space is formed between the outer tube and the heat transfer tube.

10. The solar collector device of claim 1, wherein the receiver assembly comprises a plurality of receivers sharing a same longitudinal axis, wherein the plurality of receivers are positioned such that a first end of a first receiver is aligned with a first end of a second receiver and a second end of the first receiver is aligned with a second end of the second receiver.

11. A method of collecting solar energy, the method comprising:
rotating one or more primary reflectors around a respective rotation axis, wherein each primary reflector comprises an elongated mirror rotatably coupled to a first frame structure such that each primary reflector may rotate around the respective rotation axis, wherein each rotation axis of the one or more primary reflectors is tilted toward Earth's equator at a reflector angle;

reflecting light from the one or more primary reflectors onto one or more elongated receivers of a receiver assembly, the receiver assembly comprising a second frame structure that is separate and uncoupled from the first frame structure, and each receiver including a longitudinal axis that is tilted toward Earth's equator a receiver angle, each receiver comprising at least one of a heat transfer tube and a photovoltaic panel; and translating each receiver along the second frame structure in a direction that is parallel to the respective longitudinal axis, wherein each receiver is mechanically translated by at least one of an electric pulley system and an electric ball screw system.

12. The method of claim 11, further comprising:
aligning the longitudinal axis of each receiver and the rotation axis of each of the one or more primary reflectors from north to south; and
tilting the receiver assembly and the one or more primary reflectors toward Earth's equator.

13. The method of claim 11, wherein the one or more primary reflectors is a plurality of primary reflectors that are linked together and rotated at a same speed.

14. The method of claim 11, wherein the receiver assembly comprises the heat transfer tube, and wherein the method further comprises transferring heat energy from the reflected light to a heat transfer fluid flowing through the heat transfer tube.

15. The method of claim 11, wherein the receiver assembly comprises the photovoltaic panel, and wherein the method further comprises focusing the light reflected by the one or more primary reflectors onto the photovoltaic panel.

16. The method of claim 15, wherein the receiver assembly further comprises the heat transfer tube thermally coupled to the photovoltaic panel, and wherein the method further comprises transferring heat energy from the reflected light to a heat transfer fluid flowing through the heat transfer tube.

17. The method of claim 14, wherein the heat transfer tube is positioned at a center of the receiver assembly and one or more secondary concentrators are positioned around the heat transfer tube opposite the one or more primary reflectors.

18. A system for collecting solar energy comprising:
one or more primary reflectors, each primary reflector comprising an elongated mirror rotatably coupled to a first frame structure such that each primary reflector may pivot around a rotation axis, wherein each rotation axis of the one or more primary reflectors is tilted toward Earth's equator at a reflector angle; and a receiver assembly mounted on a second frame structure that is separate and uncoupled from the first frame structure,
wherein the receiver assembly comprises one or more elongated receivers, each receiver including a longitudinal axis that is tilted toward Earth's equator at a receiver angle, and each receiver comprising at least one of a heat transfer tube and a photovoltaic panel, and
wherein each receiver assembly translates along the second frame structure in a direction that is parallel to the respective longitudinal axis, wherein each receiver is mechanically translated by at least one of an electric pulley system and an electric ball screw system;
wherein the one or more primary reflectors reflect light onto the one or more receivers.

19. The solar collector device of claim 1, wherein the one or more primary reflectors comprises a plurality of primary reflectors, wherein the solar collector device further comprises a cleaning system coupled to the first frame structure, wherein the cleaning system comprises:
a linear guide extending from a first traveler to a second traveler;
one or more wiper blades mounted on the linear guide, wherein the one or more wiper blades are in contact with an upper surface of a first primary reflector of the plurality of primary reflectors;
a first guide rail aligned with a first end of each rotation axis of the plurality of primary reflectors; and
a second guide rail aligned with a second end of each rotation axis of the plurality of primary reflectors;
wherein the one or more wiper blades are configured to translate along the linear guide in a direction that is parallel to the rotation axes of the plurality of primary reflectors;
wherein the first traveler is configured to travel along the first guide rail and the second traveler is configured to travel along the second guide rail to move the one or more wiper blades in a direction that is perpendicular to the rotation axes of the plurality of primary reflectors such that the one or more wiper blades are positioned to contact an upper surface of a subsequent primary reflector of the plurality of primary reflectors.

20. The solar collector device of claim 19, the cleaning system further comprises:
a hose for delivering a cleaning fluid though one or more nozzles positioned along the one or more wiper blades.

* * * * *